United States Patent
Zhang

(10) Patent No.: US 10,270,054 B2
(45) Date of Patent: Apr. 23, 2019

(54) ORGANIC LIGHT-EMITTING DIODE COMPONENTS INCLUDING AN INSULATING LAYER AND AN AUXILIARY ELECTRODE LAYER POSITIONED ABOVE THE INSULATING LAYER, MANUFACTURING METHODS FOR ORGANIC LIGHT-EMITTING DIODE COMPONENTS, DISPLAY PANELS INCLUDING ORGANIC LIGHT-EMITTING DIODE COMPONENTS, AND DISPLAY DEVICES

(71) Applicant: BOE TECHNOLOGY GROUP CO., LTD., Beijing (CN)

(72) Inventor: Can Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/739,941

(22) PCT Filed: Jun. 26, 2017

(86) PCT No.: PCT/CN2017/089961
§ 371 (c)(1),
(2) Date: Dec. 26, 2017

(87) PCT Pub. No.: WO2018/036258
PCT Pub. Date: Mar. 1, 2018

(65) Prior Publication Data
US 2018/0315948 A1 Nov. 1, 2018

(30) Foreign Application Priority Data
Aug. 26, 2016 (CN) .......................... 2016 1 0743210

(51) Int. Cl.
*H01L 29/08* (2006.01)
*H01L 21/00* (2006.01)
(Continued)

(52) U.S. Cl.
CPC ...... *H01L 51/5212* (2013.01); *H01L 27/3246* (2013.01); *H01L 51/001* (2013.01);
(Continued)

(58) Field of Classification Search
CPC ............. H01L 51/5212; H01L 27/3246; H01L 51/0021; H01L 51/5221; H01L 51/56
See application file for complete search history.

(56) References Cited

U.S. PATENT DOCUMENTS

| 8,368,129 B2 * | 2/2013 | Ono ........................ H01L 21/56 |
| | | 257/291 |
| 2005/0122043 A1 * | 6/2005 | Kato .................... H01L 51/5203 |
| | | 313/512 |

(Continued)

FOREIGN PATENT DOCUMENTS

| CN | 1717137 A | 1/2006 |
| CN | 1866537 A | 11/2006 |

(Continued)

OTHER PUBLICATIONS

Office Action from Chinese Application No. 201610743210.9 dated Aug. 2, 2017 (8 pages).

(Continued)

*Primary Examiner* — Alonzo Chambliss
(74) *Attorney, Agent, or Firm* — Harness, Dickey & Pierce, P.L.C.

(57) ABSTRACT

Embodiments of the disclosure provide an organic light-emitting diode component and a manufacturing method, a display panel and a display device. The organic light-emitting diode component includes: a first electrode layer, a (Continued)

light-emitting layer and a second electrode layer in sequence. The organic light-emitting diode component further includes an insulation layer and an auxiliary electrode layer. The insulation layer is above the second electrode layer. The auxiliary electrode layer is above the insulation layer and electrically connected to the first electrode layer. According to embodiments of the disclosure, while improving a problem of uneven light emission, the auxiliary electrode layer is prevented from blocking the light emitted by the organic light-emitting diode component. Also, an etching process is not necessary for forming the auxiliary electrode layer.

20 Claims, 6 Drawing Sheets

(51) Int. Cl.
    *H01L 51/52*     (2006.01)
    *H01L 51/56*     (2006.01)
    *H01L 27/32*     (2006.01)
    *H01L 51/00*     (2006.01)

(52) U.S. Cl.
    CPC ...... *H01L 51/0021* (2013.01); *H01L 51/0023* (2013.01); *H01L 51/52* (2013.01); *H01L 51/5221* (2013.01); *H01L 51/56* (2013.01); *H01L 2251/533* (2013.01)

(56) References Cited

U.S. PATENT DOCUMENTS

2005/0253508 A1   11/2005   Okano
2011/0215362 A1   9/2011   Ono et al.
2014/0361264 A1*   12/2014   Choi .................. H01L 51/5275
                                              257/40

FOREIGN PATENT DOCUMENTS

| CN | 101131959 A | 2/2008 |
|---|---|---|
| CN | 101728421 A | 6/2010 |
| CN | 101911832 A | 12/2010 |
| CN | 101968948 A | 2/2011 |
| CN | 102544054 A | 7/2012 |
| CN | 103024960 A | 4/2013 |
| CN | 103137891 A | 6/2013 |
| CN | 103219469 A | 7/2013 |
| CN | 103296052 A | 9/2013 |
| CN | 104022139 A | 9/2014 |
| CN | 104124259 A | 10/2014 |
| CN | 104885251 A | 9/2015 |
| CN | 105470278 A | 4/2016 |
| CN | 105470279 A | 4/2016 |
| CN | 106252525 A | 12/2016 |
| JP | 2012181931 A | 9/2012 |
| JP | 2014150030 A | 8/2014 |
| JP | 2014192050 A | 10/2014 |

OTHER PUBLICATIONS

International Search Report from PCT Application No. PCT/CN2017/089961 dated Sep. 26, 2017 (5 pages).

Written Opinion from PCT Application No. PCT/CN2017/089961 dated Sep. 26, 2017 (5 pages).

\* cited by examiner

ORGANIC LIGHT-EMITTING DIODE COMPONENTS INCLUDING AN INSULATING LAYER AND AN AUXILIARY ELECTRODE LAYER POSITIONED ABOVE THE INSULATING LAYER, MANUFACTURING METHODS FOR ORGANIC LIGHT-EMITTING DIODE COMPONENTS, DISPLAY PANELS INCLUDING ORGANIC LIGHT-EMITTING DIODE COMPONENTS, AND DISPLAY DEVICES

CROSS-REFERENCE TO RELATED APPLICATION

This application claims the benefit and priority of Chinese Patent Application No. 201610743210.9 filed on Aug. 26, 2016, the entire content of which is incorporated by reference herein.

FIELD

The disclosure relates to organic electroluminescent illumination and display technology, and in particular, to an organic light-emitting diode (OLED) component and a manufacturing method, a display panel and a display device.

BACKGROUND

An organic light-emitting diode (OLED) component is a focus in the field of illumination and display, which receives more and more attention. A problem existing in an OLED component is that as the size of the component increases, a drive voltage drop caused by the difference in resistance of the electrode material occurs between different parts of the component, which causes the unevenness of luminance of the OLED component.

There is room for improving OLED components.

BRIEF DESCRIPTION

Embodiments of the disclosure provide an OLED component and a manufacturing method, a display panel and a display device.

A first aspect of the disclosure provides an OLED component, including: a first electrode layer, a light-emitting layer and a second electrode layer arranged in sequence. The OLED component further includes an insulation layer and an auxiliary electrode layer. The insulation layer is arranged above the second electrode layer. The auxiliary electrode layer is arranged above the insulation layer and electrically connected to the first electrode layer.

In embodiments of the disclosure, the OLED component further includes a pixel definition layer. The pixel definition layer is arranged above the first electrode layer, and defines a pixel definition region. The light-emitting layer, the second electrode layer and the insulation layer are arranged in the pixel definition region. The pixel definition layer has a via, and the auxiliary electrode layer is electrically connected to the first electrode layer through the via of the pixel definition layer.

In embodiments of the disclosure, the OLED component further includes a pixel definition layer. The pixel definition layer is arranged above the first electrode layer, and defines a pixel definition region. The light-emitting layer and the second electrode layer are arranged in the pixel definition region. The insulation layer is arranged in the pixel definition region and above the pixel definition layer. The pixel definition layer has a via and the insulation layer has a via. The via of the insulation layer is arranged above the via of the pixel definition layer. The auxiliary electrode layer is electrically connected to the first electrode layer through the via of the insulation layer and the via of the pixel definition layer.

In embodiments of the disclosure, the first electrode layer is an anode layer and the second electrode layer is a cathode layer.

In embodiments of the disclosure, the first electrode layer is a transparent electrode layer and the second electrode layer is a reflective electrode layer.

A second aspect of the disclosure provides a manufacturing method for an OLED component, to manufacture the above described OLED component. The method includes: forming a first electrode layer; forming a pixel definition layer above the first electrode layer, wherein the pixel definition layer defines a pixel definition region, and the pixel definition layer has a via; forming a light-emitting layer and a second electrode layer above the first electrode layer and in the pixel definition region; and forming an insulation layer above the second electrode layer and in the pixel definition region; forming an auxiliary electrode layer above the insulation layer, wherein the auxiliary electrode layer and the first electrode layer are electrically connected through the via of the pixel definition layer.

In embodiments of the disclosure, the manufacturing method for the OLED component further includes: forming the insulation layer above the pixel definition layer. The insulation layer has a via, and the via of the insulation layer is above the via of the pixel definition layer. In the step of forming the auxiliary electrode layer, the auxiliary electrode layer and the first electrode layer are electrically connected through the via of the insulation layer and the via of the pixel definition layer.

In embodiments of the disclosure, the insulation layer is formed using a chemical vapor deposition method adopting an open mask.

In embodiments of the disclosure, the auxiliary electrode layer is formed using an evaporation method.

In embodiments of the disclosure, the auxiliary electrode layer is formed using an evaporation method adopting an open mask or a fine metal mask.

A third aspect of the disclosure provides a display panel. The display panel includes a substrate and a plurality of the above-described OLED components arranged above the substrate.

A fourth aspect of the disclosure provides a display device including the above-described display panel.

BRIEF DESCRIPTION OF THE DRAWINGS

In order to more clearly illustrate the technical solutions of the embodiments of the disclosure, the drawings of the embodiments will be briefly described below, and it should be appreciated that the drawings described below merely relate to some of the embodiments of the disclosure, rather than limit the disclosure, in which.

DETAILED DESCRIPTION

In order to make the technical solutions and advantages of the embodiments of the disclosure clearer, the technical solutions of the embodiments of the disclosure will be clearly and fully described below in conjunction with the accompanying drawings. It is obvious that the described embodiments are part, instead of all, of the embodiments of the disclosure. All other embodiments obtained by those skilled in the art based on the described embodiments of the disclosure without the need for creative labor also fall within the scope of the disclosure.

Figure 1:
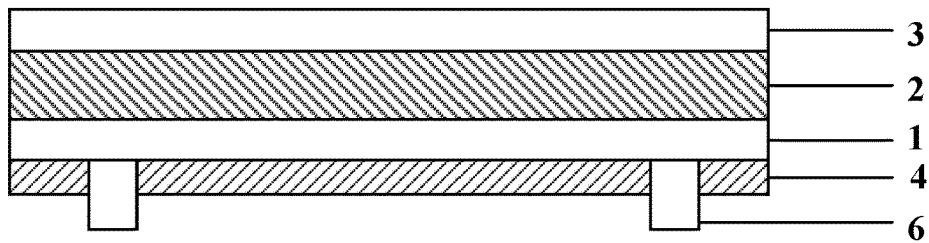
FIG. 1 is a schematic layer structure diagram of an OLED component.

FIG. 1 is a schematic layer structure diagram of an OLED component. As shown in FIG. 1, the OLED component includes an auxiliary electrode layer 6, an insulation layer 4, a transparent electrode layer 1, a light-emitting layer 2 and a reflective electrode layer 3 which are sequentially layered. The insulation layer 4 is arranged with a via such that the transparent electrode layer 1 and the auxiliary electrode layer 6 are connected. In general, when the transparent electrode layer 1 is made of a conductive ITO material, the OLED component is plated with a layer of highly conductive metal to form the auxiliary electrode layer 6, so as to improve the conductivity uniformity of the transparent electrode layer 1 and solve the problem that the luminance of the OLED component, especially a large-sized one, is uneven. The material of the auxiliary electrode layer 6 can be Cr, Mo/Al/Mo, Ag, etc., with good electrical conductivity and less square resistance. Due to the existence of the auxiliary electrode layer 6, the luminance uniformity of the OLED display panel is greatly improved, and this manner can also be applied to a white organic light-emitting diode (WOLED) panel.

However, in general, the auxiliary electrode layer 6 is made of an opaque metal material, and light can not pass through. The auxiliary electrode layer 6 needs to cover the transparent electrode layer 1 in an interconnected mesh structure, which blocks the light emitted by the OLED component. Therefore, after the auxiliary electrode layer 6 is added, a larger drive current is required in order to maintain the same luminance, which increases power consumption and cost. In addition, this also reduces the aperture ratio of the display panel using the OLED component.

Figure 2:
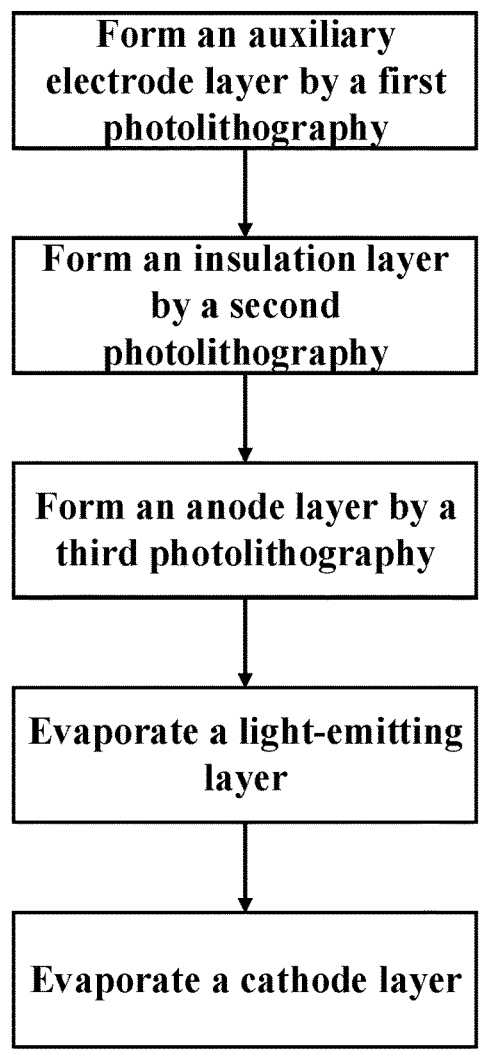
FIG. 2 is a schematic flow chart of a manufacturing method for an OLED component.

FIG. 2 is a schematic flow chart of a manufacturing method for an OLED component. As shown in FIG. 2, the manufacturing method for an OLED component includes: forming an auxiliary electrode layer by a first photolithography, forming an insulation layer by a second photolithography, forming an anode layer by a third photolithography, evaporating a light-emitting layer and evaporating a cathode layer, so as to obtain the structure shown in FIG. 1. In order to obtain interconnected meshes to improve light transmittance as far as possible, a photolithography manner is used in forming the auxiliary electrode layer 6. An etching process is required during the photolithography, and the cost is increased.

Embodiments of the disclosure provide an OLED component. The OLED component includes a first electrode layer 1, a light-emitting layer 2, a second electrode layer 3 and an insulation layer 4 arranged in sequence. The OLED component further includes an auxiliary electrode layer 6 arranged above the insulation layer 4 and electrically connected to the transparent electrode layer 1. Hereinafter, the description will be given by example of the first electrode layer 1 as a transparent electrode layer and the second electrode layer 3 as a reflective electrode layer. It should be understood that this is not a limitation of the present invention.

The light emitted by the OLED component is emitted from the light-emitting layer 2 toward the transparent electrode layer 1, while the auxiliary electrode layer 6 is located in the opposite direction. Thus, the auxiliary electrode layer 6 does not block the light emitted from the OLED component. According to embodiments of the disclosure, the luminance of the OLED display panel will not be changed while the luminance uniformity of the OLED display panel is improved. The transparent electrode layer 1 can be an anode layer, and in this case, the reflective electrode layer 3 is a cathode layer. The transparent electrode layer 1 can be a cathode layer, and in this case, the reflective electrode layer 3 is an anode layer.

Figure 3:
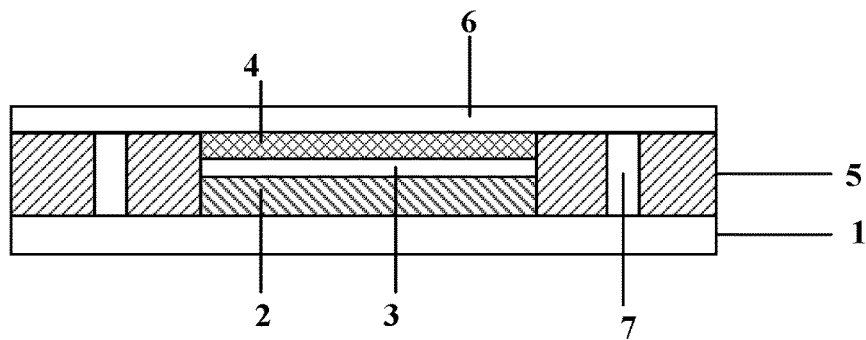
FIG. 3 is a schematic layer structure diagram of an OLED component according to a first embodiment of the disclosure.

FIG. 3 is a schematic layer structure diagram of an OLED component provided according to a first embodiment of the disclosure. As shown in FIG. 3, in embodiments of the disclosure, the OLED component includes a transparent electrode layer 1, a pixel definition layer 5, a light-emitting layer 2, a reflective electrode layer 3 and an insulation layer 4. The pixel definition layer 5 is arranged above the transparent electrode layer 1, and defines a pixel definition region. The light-emitting layer 2, the reflective electrode layer 3 and the insulation layer 4 are arranged above the transparent electrode layer 1 in sequence and arranged in the pixel definition region. The OLED component further includes an auxiliary electrode layer 6 arranged above the insulation layer 4 and connected to the transparent electrode layer 1 through the via 7 of the pixel definition layer 5.

The light emitted by the OLED component is emitted from the light-emitting layer 2 toward the transparent electrode layer 1 while the auxiliary electrode layer 6 is located in the opposite direction. Thus, the auxiliary electrode layer 6 does not block the light emitted from the OLED component. According to embodiments of the disclosure, the luminance of the OLED display panel will not be changed while the luminance uniformity of the OLED display panel is improved.

In addition, as shown in FIG. 3, the insulation layer 4 is provided in the pixel definition region and can be formed using the same or similar mask as the light-emitting layer 2 and the reflective electrode layer 3, simplifying the manufacturing process.

Figure 4:
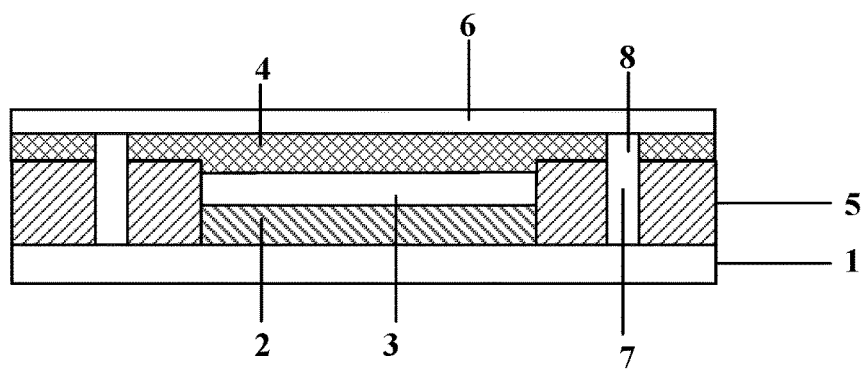
FIG. 4 is a schematic layer structure diagram of an OLED component according to a second embodiment of the disclosure.

FIG. 4 is a schematic layer structure diagram of an OLED component provided according to a second embodiment of the disclosure. In embodiments of the disclosure, the insulation layer 4 is arranged in the pixel definition region and above the pixel definition layer 5, and has a via 8. The insulation layer 4 can be extended for packaging the OLED component. In this case, the insulation layer 4 has the via 8 above the via 7. The via 7 and the via 8 enable the electrical connection between the auxiliary electrode layer 6 and the transparent electrode layer 1.

Figure 5:
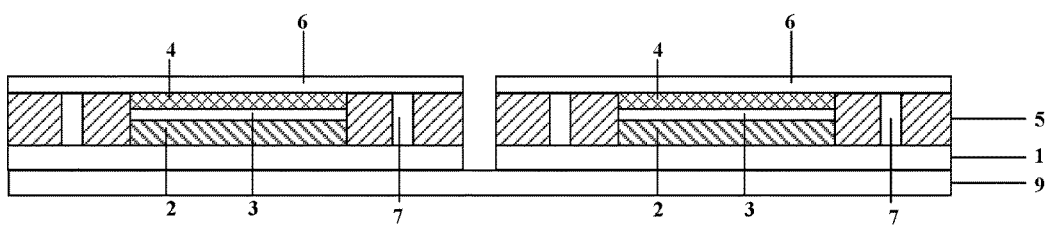
FIG. 5 is a schematic layer structure diagram of an OLED display panel according to a third embodiment of the disclosure.

FIG. 5 is a schematic layer structure diagram of an OLED display panel provided according to a third embodiment of the disclosure. In embodiments of the disclosure, the OLED display panel includes a substrate 9 and a plurality of the above-described OLED components arranged above the substrate 9. A plurality of OLED components shown in FIG. 3 are shown in FIG. 5, but it can be understood that the OLED components in FIG. 5 can also be OLED components shown in FIG. 4.

The auxiliary electrode layer does not block the light emitted by the OLED component. Therefore, during manufacturing the OLED display panel, the auxiliary electrode layer of the entire panel can be formed into any pattern without being limited to the grid structure. In this way, not only can the square resistance be further reduced and the luminance uniformity be improved, the etching process may be also removed, and the manufacturing method is simplified.

Figure 6:
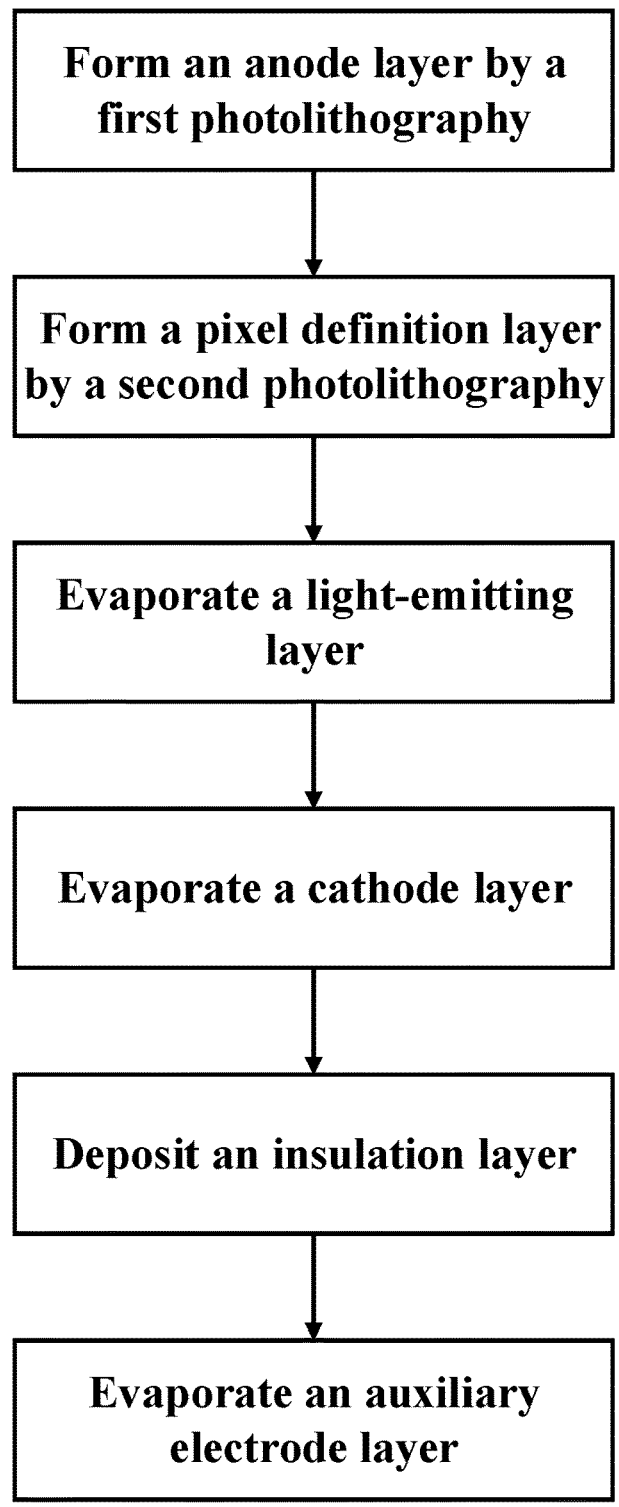
FIG. 6 is a schematic flow chart of a manufacturing method for an OLED component according to a fourth embodiment of the disclosure.
Figure 7:
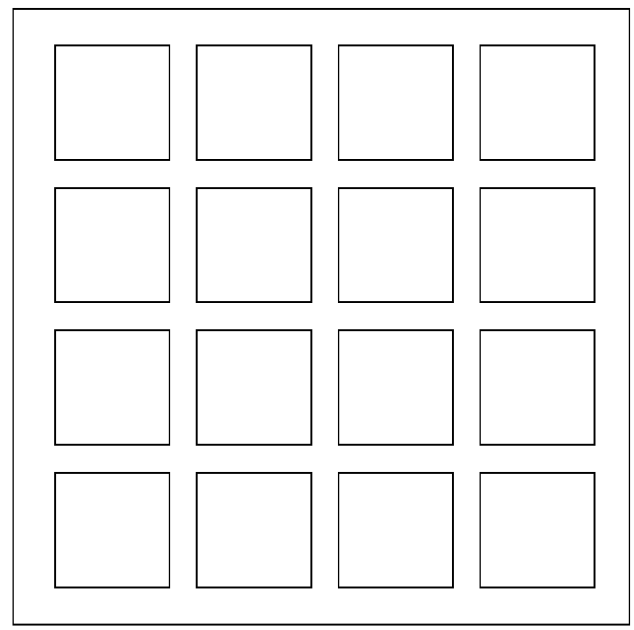
FIG. 7 is a schematic plan view of an OLED display panel after a transparent electrode layer is formed above a substrate in the method shown in FIG. 6.
Figure 8:
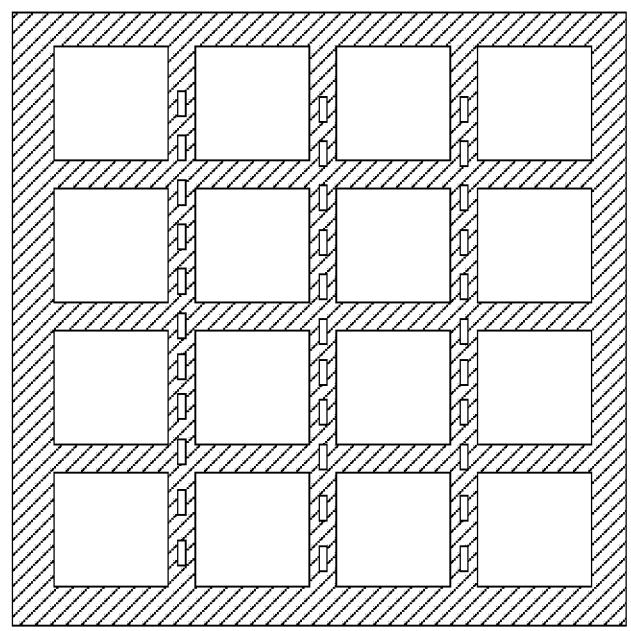
FIG. 8 is a schematic plan view of the OLED display panel after a pixel definition layer is formed in the method shown in FIG. 6.
Figure 9:
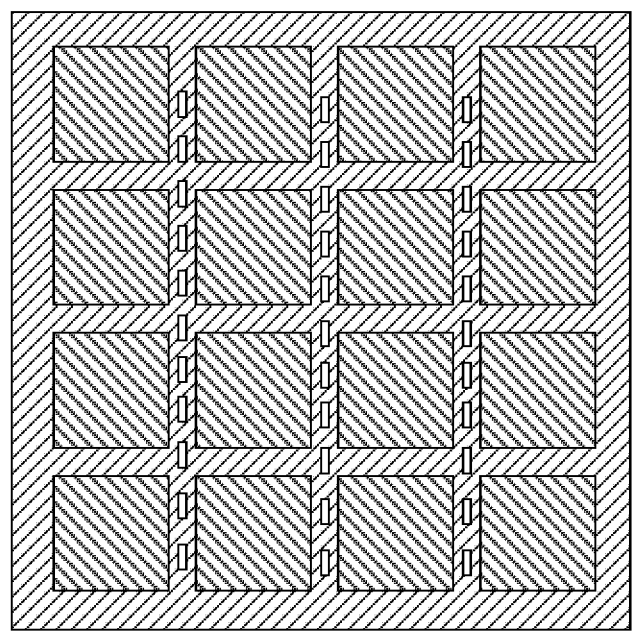
FIG. 9 is a schematic plan view of the OLED display panel after a light-emitting layer and a reflective electrode layer are formed in the method shown in FIG. 6.
Figure 10:
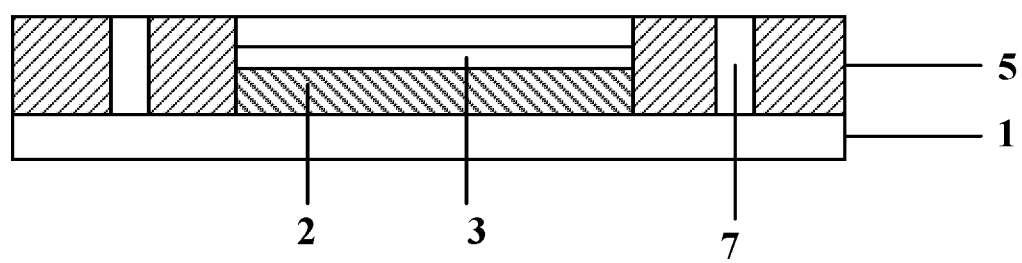
FIG. 10 is a schematic layer structure diagram of the OLED component in the OLED display panel after the light-emitting layer and the reflective electrode layer are formed in the method shown in FIG. 6.

FIG. 6 is a schematic flow chart of a manufacturing method for an OLED component provided according to a fourth embodiment of the disclosure. FIG. 7 is a schematic plan view of the OLED display panel after the transparent electrode layer is formed above the substrate in the method shown in FIG. 6. FIG. 8 is a schematic plan view of the OLED display panel after the pixel definition layer is formed in the method shown in FIG. 6. FIG. 9 is a schematic plan view of the OLED display panel after the light-emitting layer and the reflective electrode layer are formed in the method shown in FIG. 6. FIG. 10 is a schematic layer structure diagram of the OLED component in the OLED display panel after the light-emitting layer and the reflective electrode layer are formed in the method shown in FIG. 6.

As shown in FIG. 6, in embodiments of the disclosure, a manufacturing method for an OLED component is used to manufacture the above OLED component. The method includes: forming a transparent electrode layer 1; forming a pixel definition layer 5 above the transparent electrode layer 1, wherein the definition layer 5 defines a pixel definition region, and the pixel definition layer 5 has a via 7; forming a light-emitting layer 2 and a reflection electrode layer 3 above the transparent electrode layer 1 and in the pixel definition region; forming an insulation layer 4 above the reflection electrode layer 3 and in the pixel definition region; forming an auxiliary electrode layer 6 above the insulation layer 4, wherein the auxiliary electrode layer 6 and the transparent electrode layer 1 are electrically connected through the via 7 of the pixel definition layer 5.

In embodiments of the disclosure, the insulation layer 4 is arranged in the pixel definition region and can be formed using the same or similar mask as the light-emitting layer 2 and the reflective electrode layer 3, thereby simplifying the manufacturing process.

In embodiments of the disclosure, during forming the insulation layer 4, the insulation layer 4 may also be arranged in the pixel definition region and above the pixel definition layer 5, and the insulation layer 4 may include a via 8 located above the via 7. During forming the auxiliary electrode layer 6, the auxiliary electrode layer 6 and the transparent electrode layer 1 are electrically connected through the via of the insulation layer 4 and the via of the pixel definition layer 5. In this way, the insulation layer 4 can be extended for packaging the OLED component. In this case, the insulation layer 4 has the via 8, and the via 7 and the via 8 enable the connection between the auxiliary electrode layer 6 and the transparent electrode layer 1.

In embodiments of the disclosure, the auxiliary electrode layer 6 can be formed using an evaporation method, in particular, an evaporation method adopting an open mask. In addition, a fine metal mask may also be used.

The evaporation method using the mask can include the following steps. First, a mask having an open region is coated on a surface to be evaporated on. Then, the surface is evaporated on. At this time, the material is evaporated at a position corresponding to the open region of the mask on the surface, while the other position is covered and the material is not evaporated thereon. In this way, the auxiliary electrode layer 6 of a predetermined pattern can be obtained by one evaporation without etching.

Of course, the entire auxiliary electrode layer 6 can also be obtained by direct evaporation if necessary.

As shown in FIG. 7, in embodiments of the disclosure, the transparent electrode layer 1 of the OLED component may use an ITO material, and the transparent electrode layer 1 for a plurality of OLED components can be obtained on the OLED display panel by patterning with photolithography.

As shown in FIG. 8, the pixel definition layer 5 of the OLED component is formed, and the pixel definition layer 5 defines a plurality of regions corresponding to the transparent electrode layer 1 for the plurality of OLED components for forming the plurality of OLED components. There is a via 7 left in the pixel definition layer 5 for the connection between the auxiliary electrode layer 6 and the transparent electrode layer 1.

As shown in FIG. 9 and FIG. 10, in embodiments of the disclosure, the light-emitting layer 2 and the reflective electrode layer 3 are evaporated in sequence above the transparent electrode layer using an evaporation method adopting an open mask. In addition, the material of the reflective electrode layer 3 can be Al. Between the transparent electrode layer 1 and the reflective electrode layer 3, a light-emitting functional layer such as a hole injection layer, a hole transport layer, an electron injection layer, etc. (not shown) can be further included.

Finally, referring back to FIG. 3 or FIG. 4, in embodiments of the disclosure, the insulation layer 4 can be deposited by a chemical vapor deposition (CVD) method for isolating the reflective electrode layer 3 from the auxiliary electrode layer 6. As shown in FIG. 4, the insulation layer 4 can also function to package the OLED component. The insulation layer 4 may be a ceramic film such as $SiN_x$ or $SiO_2$. In addition, an open mask is also used for depositing the insulation layer 4. When the insulation layer 4 is further arranged above the pixel definition layer, the pattern of the open mask can cover the corresponding positions of the via 7 and the via 8 to form the via 8 and retain the via 7, which enables the auxiliary electrode layer 6 to be connected to the transparent electrode layer 1 through the via 8 of the insulation layer 4 and the via 7 of the pixel definition layer 5.

In embodiments of the disclosure, it is ensured during manufacturing that neither the evaporated layer nor the deposited layer (including the light-emitting layer 2, the reflective electrode layer 3 and the insulation layer 4) in the pixel definition region covers the via 7 arranged in advance at the pixel definition layer 5, to ensure the connection between the auxiliary electrode layer 6 and the transparent electrode layer 1.

Figure 11:
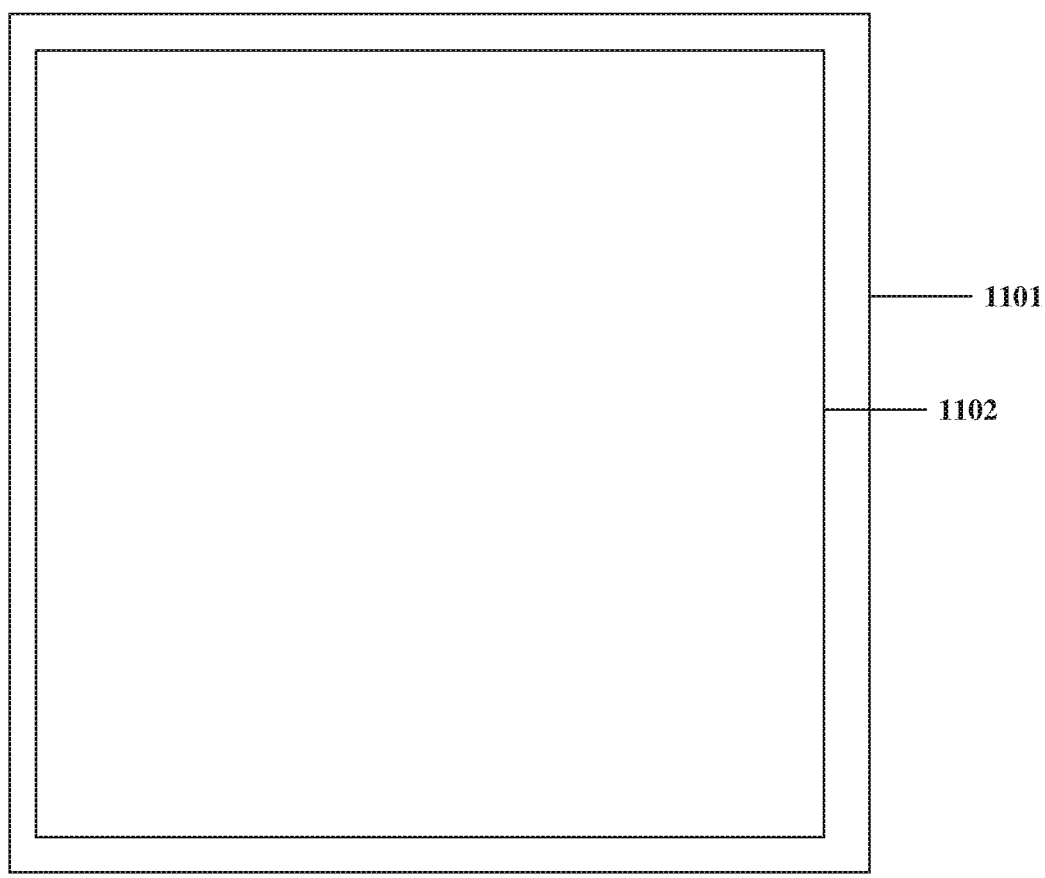
FIG. 11 is a schematic block diagram of a display device including a display panel.

FIG. 11 is a schematic block diagram of a display device including a display panel.

The OLED component and the OLED display panel 1101 provided in embodiments of the disclosure can be applied to an OLED display device 1102. The OLED display device 1102 can be any product or component with a display function, such as a mobile phone, a tablet computer, a television, a display, a notebook computer, a digital photo frame, a navigator, etc.

In embodiments of the disclosure, after the reflective electrode layer 3 is evaporated, the insulation layer 4 is deposited, the auxiliary electrode layer 6 is evaporated on the insulation layer 4, and the auxiliary electrode layer 6 is connected to the transparent electrode layer 1 through the via 7, which can reduce the voltage drop of the transparent electrode layer 1, and will not affect light output. The auxiliary electrode layer 6 does not need to be etched into a grid structure and can be evaporated on the entire surface, removing the etching process, further simplifying the manufacturing process of the OLED component and improving the production efficiency of the OLED component.

It can be understood that the above embodiments are merely exemplary embodiments used for illustrating the principle of the disclosure, but the disclosure is not limited thereto. For those of ordinary skill in the art, various variations and improvements can be made without departing from the spirit and essence of the disclosure, and these variations and improvements also fall within the protection scope of the disclosure.

What is claimed is:

1. An organic light-emitting diode component comprising a first electrode layer, a light-emitting layer and a second electrode layer, in sequence;
    wherein the organic light-emitting diode component further comprises an insulation layer, an auxiliary electrode layer and a pixel definition layer;
    wherein the insulation layer is positioned above the second electrode layer;
    wherein the auxiliary electrode layer is positioned above the insulation layer and electrically connected to the first electrode layer;
    wherein the pixel definition layer is positioned above the first electrode layer, and includes a plurality of open regions;
    wherein an open region of the plurality of open regions corresponds to a pixel definition region; and
    wherein the light-emitting layer and the second electrode layer are positioned in the pixel definition region.

2. The organic light-emitting diode component according to claim 1,
    wherein the insulation layer is positioned in the pixel definition region;
    wherein the pixel definition layer includes via; and
    wherein the auxiliary electrode layer is electrically connected to the first electrode layer through the via of the pixel definition layer.

3. The organic light-emitting diode component according to claim 2, wherein the first electrode layer is an anode layer and the second electrode layer is a cathode layer.

4. The organic light-emitting diode component according to claim 2, wherein the first electrode layer is a transparent electrode layer and the second electrode layer is a reflective electrode layer.

5. A The display panel comprising:
    a substrate; and
    a plurality of organic light-emitting diode components positioned above the substrate, the plurality of organic light-emitting diode components including the organic light-emitting diode component according to claim 2.

6. The organic light-emitting diode component according to claim 1,
    wherein the insulation layer is positioned in the pixel definition region and above the pixel definition layer;
    wherein the pixel definition layer includes a via, and the insulation layer includes a via;
    wherein the via of the insulation layer is positioned above the via of the pixel definition layer; and
    wherein the auxiliary electrode layer is electrically connected to the first electrode layer through the via of the insulation layer and the via of the pixel definition layer.

7. The organic light-emitting diode component according to claim 6, wherein the first electrode layer is an anode layer and the second electrode layer is a cathode layer.

8. The organic light-emitting diode component according to claim 6, wherein the first electrode layer is a transparent electrode layer and the second electrode layer is a reflective electrode layer.

9. A display panel comprising:
    a substrate; and
    a plurality of organic light-emitting diode components positioned above the substrate, the plurality of organic light-emitting diode components including the organic light-emitting diode component according to claim 6.

10. The organic light-emitting diode component according to claim 1, wherein the first electrode layer is an anode layer and the second electrode layer is a cathode layer.

11. The organic light-emitting diode component according to claim 1, wherein the first electrode layer is a transparent electrode layer and the second electrode layer is a reflective electrode layer.

12. A display panel comprising:
    a substrate; and
    a plurality of organic light-emitting diode components positioned above the substrate, the plurality of organic light-emitting diode components including the organic light-emitting diode component according to claim 1.

13. A display device comprising the display panel according to claim 12.

14. A manufacturing method for an organic light-emitting diode component, the method comprising:
    forming a first electrode layer;
    forming a pixel definition layer above the first electrode layer, the pixel definition layer including a via and a plurality of open regions, an open region of the plurality of open regions corresponding to a pixel definition region;
    forming a light-emitting layer and a second electrode layer above the first electrode layer and in the pixel definition region;
    forming an insulation layer above the second electrode layer and in the pixel definition region; and
    forming an auxiliary electrode layer above the insulation layer, the auxiliary electrode layer and the first electrode layer electrically connected through the via of the pixel definition layer.

15. The manufacturing method according to claim 14,
wherein forming the insulation layer includes forming the insulation layer above the pixel definition layer;
wherein the insulation layer includes a via above the via of the pixel definition layer; and
wherein forming the auxiliary electrode layer includes forming the auxiliary electrode layer so that the auxiliary electrode layer and the first electrode layer are electrically connected through the via of the insulation layer and the via of the pixel definition layer.

16. The manufacturing method according to claim 15, wherein forming the insulation layer includes forming the insulation layer with a chemical vapor deposition method adopting an open mask.

17. The manufacturing method according to claim 15, wherein forming the auxiliary electrode layer includes forming the auxiliary electrode layer with an evaporation method.

18. The manufacturing method according to claim 14, wherein forming the insulation layer includes forming the insulation layer with a chemical vapor deposition method adopting an open mask.

19. The manufacturing method according to claim 14, wherein forming the auxiliary electrode layer includes forming the auxiliary electrode layer with an evaporation method.

20. The manufacturing method according to claim 19, wherein forming the auxiliary electrode layer includes forming the auxiliary electrode layer with the evaporation method adopting an open mask or a fine metal mask.

* * * * *